(12) United States Patent
Takada et al.

(10) Patent No.: US 6,649,965 B2
(45) Date of Patent: Nov. 18, 2003

(54) SEMICONDUCTOR DEVICE AND METHOD OF MANUFACTURING THE SAME

(75) Inventors: Kazuhiko Takada, Kawasaki (JP); Shinji Sugatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/091,507

(22) Filed: Mar. 7, 2002

(65) Prior Publication Data

US 2002/0195645 A1 Dec. 26, 2002

(30) Foreign Application Priority Data

Jun. 26, 2001 (JP) .................................... 2001-192825

(51) Int. Cl.⁷ .............................................. H01L 29/76
(52) U.S. Cl. ........................................ 257/314; 257/315
(58) Field of Search .................................. 257/314, 315

(56) References Cited

U.S. PATENT DOCUMENTS 6,222,225 B1 * 4/2001 Nakamura et al. ........... 257/315
6,417,047 B1 * 7/2002 Isobe ......................... 438/258
6,462,373 B2 * 10/2002 Shimizu et al. .............. 257/315

FOREIGN PATENT DOCUMENTS

| JP | 3-44034 | 2/1991 |
| JP | 4-192422 | 7/1992 |
| JP | 10-256399 | 9/1998 |
| JP | 11-163304 | 6/1999 |
| JP | 2000-12813 | 1/2000 |
| JP | 2000-188346 | 7/2000 |

* cited by examiner

*Primary Examiner*—David Nelms
*Assistant Examiner*—Tu Tu Ho
(74) *Attorney, Agent, or Firm*—Armstrong, Westerman & Hattori, LLP

(57) ABSTRACT

There are provided the steps of forming a tunnel insulating film on a semiconductor substrate, forming a first semiconductor film constituting a lower portion of a floating gate on the tunnel insulating film, forming device isolation recesses by etching device isolation regions on the first semiconductor film, the tunnel insulating film, and the semiconductor substrate, forming an device isolation insulating film in the device isolation recesses and on the first semiconductor film, removing the device isolation insulating film from an upper surface of the first semiconductor film and thinning the device isolation insulating film on the device isolation recesses, growing selectively a second semiconductor film serving as an upper portion of the floating gate on the first semiconductor film and growing the second semiconductor film on the device isolation insulating film to extend in the lateral direction, forming a dielectric film on the floating gate, and forming a conductive film serving as a control gate on the dielectric film.

18 Claims, 16 Drawing Sheets

SEMICONDUCTOR DEVICE AND METHOD OF MANUFACTURING THE SAME

CROSS-REFERENCE TO RELATED APPLICATIONS

This application is based upon and claims priority of Japanese Patent Application No. 2001-192825, filed in Jun. 26, 2001, the contents being incorporated herein by reference.

BACKGROUND OF THE INVENTION

1. Field of the Invention

The present invention relates to a semiconductor device and a method of manufacturing the same and, more particularly, a semiconductor device having a nonvolatile memory and a method of manufacturing the same.

2. Description of the Prior Art

The flash EEPROM as the writable nonvolatile memory is important in the semiconductor device because of its convenience. As for EEPROM, a larger scale memory capacity and a lower cost in unit of bit are demanded.

In order to respond to such demands, it is important to proceed with the miniaturization of the flash memory cell. Recently it is reported that the memory cells are miniaturized by the technique of STI (Shallow Trench Isolation) to isolate the elements mutually. Such technology is set forth in Nikkei Microdevice, March 2000, pp. 82–86, for example.

The flash memory cell utilizing STI makes it possible to proceed with the miniaturization while avoiding the bird's beak problem caused when the device isolation structure formed by the LOCOS (Local Oxidation of Silicon) method in the prior art is utilized.

The flash memory cell utilizing STI may be formed by steps described in the following, for example.

First, as shown in FIG. 1A, a tunnel oxide film 102, a first silicon film 103, and a first silicon nitride film 104 are formed sequentially on a silicon substrate 101, then a mask is formed in the region serving as the channel of the flash memory cell, and then device isolation recesses 105 for the STI are formed by etching the first silicon nitride film 104 to an upper layer portion of the silicon substrate 101.

Then, an $SiO_2$ film 106 is formed in the device isolation recesses 105 and on the silicon nitride film 104 by the CVD method. Then, the $SiO_2$ film 106 is polished by the CMP method to remove from an upper surface of the first silicon nitride film 104 and to leave in the device isolation recesses 105. Therefore, the device isolation recesses 105 and the $SiO_2$ film 106 formed therein can function as the STI.

Then, the first silicon nitride film 104 is selectively etched. Then, as shown in FIG. 1B, a second silicon film 107 and a second silicon nitride film 108 are formed sequentially on the $SiO_2$ film 106 and the first silicon film 103. The first silicon film 103 and the second silicon film 107 are formed as a floating gate by the patterning.

Then, as shown in FIG. 1C, the second silicon nitride film 108 is patterned into shapes that are separated on the device isolation recesses 105. In addition, a third silicon nitride film 109 is formed on the overall surface, and then this third silicon nitride film 109 is etched by the anisotropic etching and is left on side walls of the second silicon nitride film 108 as sidewall spacers.

Then, as shown in FIG. 1D, the second silicon film 107 is divided on the device isolation recesses 105 by etching the second silicon film 107 while using the patterned second and third silicon nitride films 108, 109 as a mask.

Then, the second and third silicon nitride films 108, 109 are removed, and then an ONO film 111 and a third silicon film 112 are formed in sequence on the overall surface. Then, the third silicon film 112 is patterned into a shape of the control gate and also the second silicon film 107 is patterned into a shape of the floating gate 110 (FIG. 1E).

In steps described above, the reason for patterning the second silicon film 107 by using the second silicon nitride film 108 and the sidewalls formed on the side walls of the film 108 as the mask is to increase the coupling capacity between the floating gate 110 and the control gate 112.

However, according to above-mentioned steps, the alignment of the exposure mask used to pattern the second silicon nitride film 108 on the second silicon film 107 is needed. Therefore, since the displacement margin must be assured, such margin makes it difficult to proceed the further miniaturization.

SUMMARY OF THE INVENTION

It is an object of the present invention to provide a semiconductor device manufacturing method capable of achieving the miniaturization of the memory cell rather than the prior art.

Then, advantages of the present invention will be explained hereunder.

According to the present invention, the second semiconductor film is selectively grown on the first semiconductor film being put between the device isolation insulating films in the STI structure, and also the second semiconductor film is grown to extend over the device isolation insulating film. In this case, the first semiconductor film and the second semiconductor film serve as the floating gate of the flash memory cell.

Therefore, since the area of the floating gate that overlaps with the control gate becomes wider than the area of the floating gate that contacts to the tunnel insulating film, the higher integration of the memory cell can be achieved and also the nonvolatile memory cell having the high coupling capacitance between the floating gate and the control gate can be formed.

Since the upper portion of the floating gate is shaped in a self-aligned manner, there is no need to execute the patterning using the mask and thus the problem of positional displacement does not occur. Therefore, the alignment margin can be made small by such displacement and the reduction of the cell area can be achieved.

Also, when the dielectric film is formed on the floating gate and then the film serving as the control gate is formed, the etching residue is hardly generated on the gentle curved surface of the upper surface of the control gate in patterning this film. Thus, the working can be made easy.

In addition, as the result that side portions of the upper surface of the second semiconductor film serving as the floating gate are formed as the smooth curved surface, the film thickness of the dielectric film, e.g., the ONO film, formed on the upper surface of the floating gate becomes uniform, and thus the electric field concentration applied to the dielectric film can be avoided. As a result, the insulating withstanding voltage between the control gate and the floating gate can be maintained high, and the nonvolatile memory with the higher reliability can be formed.

DESCRIPTION OF THE PREFERRED EMBODIMENTS

Embodiments of the present invention will be explained with reference to the accompanying drawings hereinafter.

(First Embodiment)

FIGS. 2A to 2M are perspective sectional views showing semiconductor device manufacturing steps according to a first embodiment of the present invention. Also, FIGS. 3A to 3E are sectional views showing the semiconductor device manufacturing steps according to the first embodiment of the present invention.

Figure 1A:
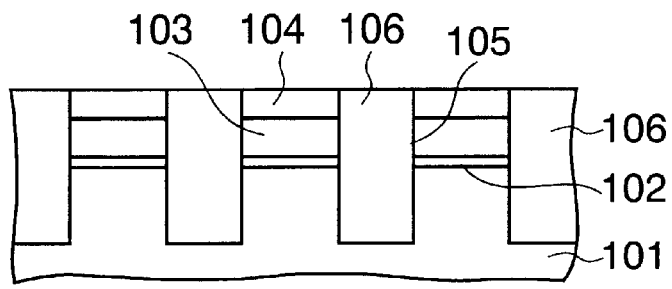
FIGS. 1A to 1E are sectional views showing steps of forming a flash memory cell in the prior art.
Figure 1B:
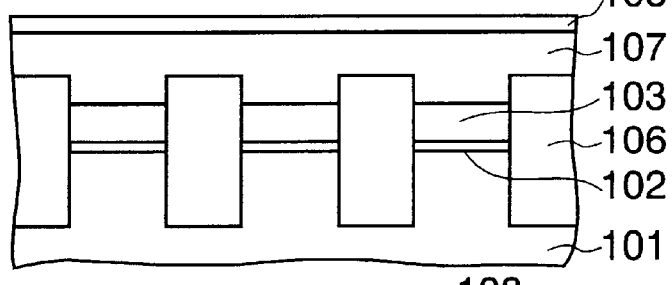
Figure 1C:
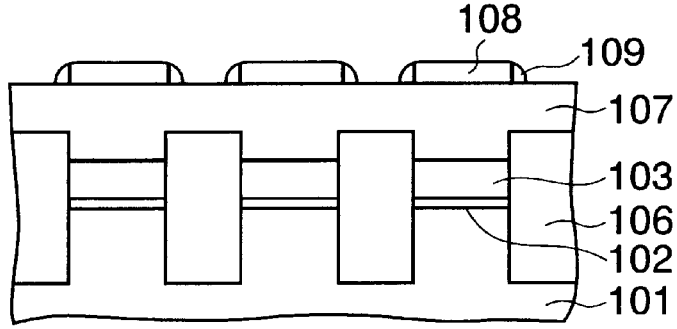
Figure 1D:
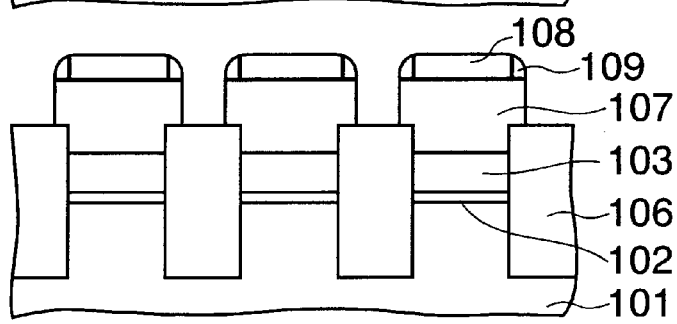
Figure 1E:
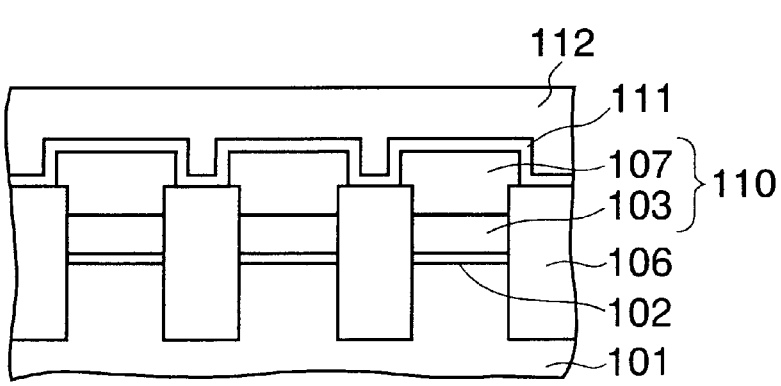
Figure 2A:
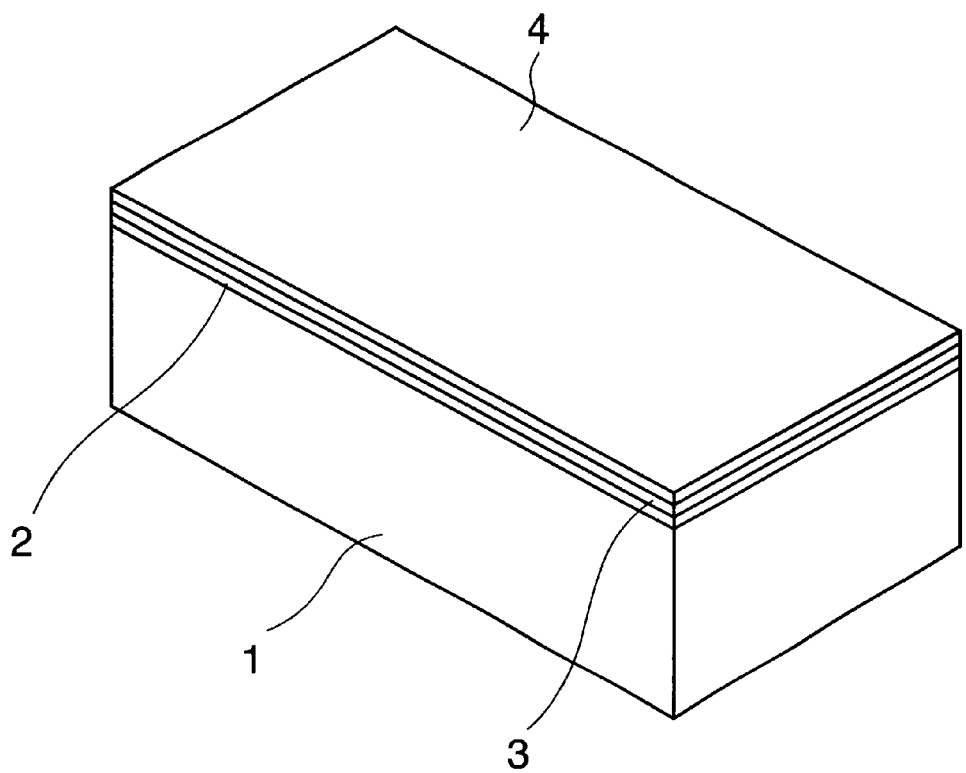
FIGS. 2A to 2M are perspective views showing steps of forming a flash memory cell according to a first embodiment of the present invention.

First, steps required to get a structure shown in FIG. 2A will be explained hereunder.

A well (not shown) is formed by ion-implanting the impurity into a predetermined region of a silicon (semiconductor) substrate 1. Then, a tunnel oxide film (insulating film) 2 made of $SiO_2$ is formed on an upper surface of the silicon substrate 1 by the thermal oxidation method to have a thickness of 10 nm.

Then, a first silicon film 3 made of polysilicon and serving as a part of the floating gate is grown on the tunnel oxide film 2 by the CVD method to have a thickness of 10 nm. In this growing, phosphorus is doped into the first silicon film 3 to get an impurity concentration of $0.5 \times 10^{20}$ atm/cm$^3$, for example. Phosphine ($PH_3$) is employed as the phosphorus doping gas.

Then, a first silicon nitride film 4 of 10 nm thickness is grown on the first silicon film 3 by the CVD method.

Figure 2B:
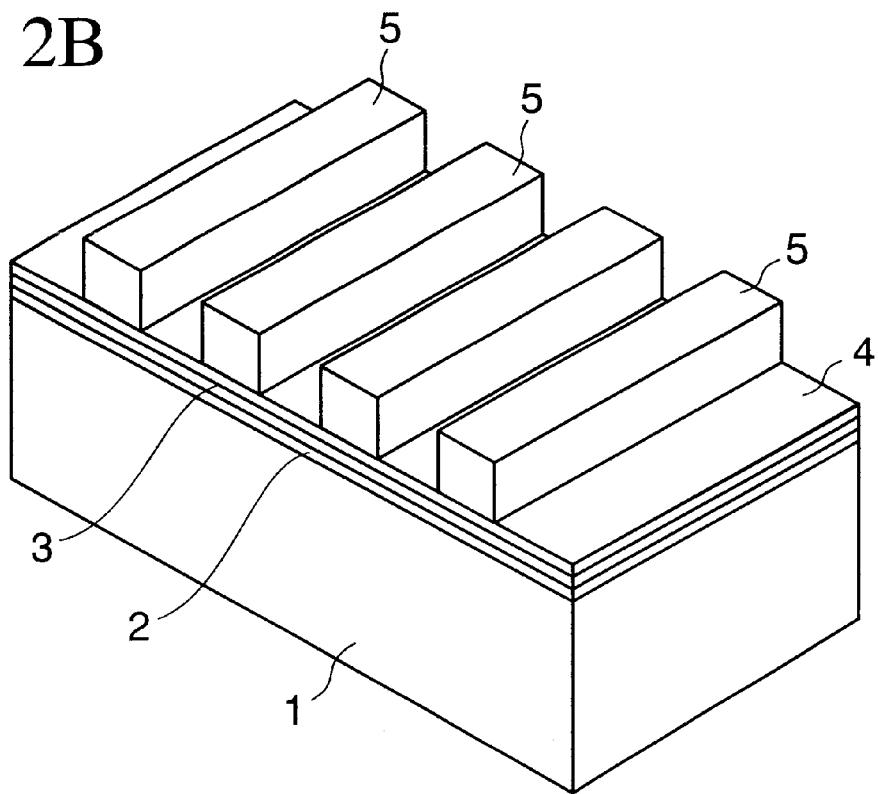

Then, as shown in FIG. 2B, a plurality of stripe-like first resist patterns 5 for covering device forming regions of the flash memory cell are formed at a distance by coating the resist on the first silicon nitride film 4 and then exposing/developing such resist. A width of the first resist pattern 5 is set to 0.24 μm, for example, and a width between the first resist patterns 5 is set to 0.32 μm, for example.

Figure 2C:
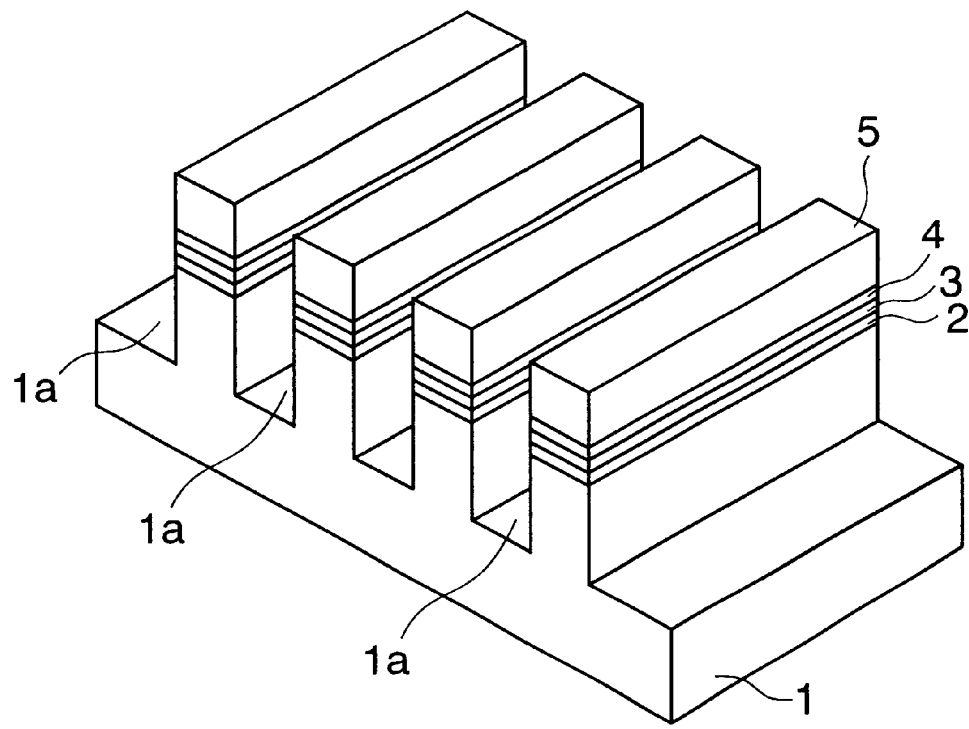

Then, as shown in FIG. 2C, device isolation recesses 1a are formed in regions between the first resist patterns 5 by etching the first silicon nitride film 4, the first silicon film 3, the tunnel oxide film 2, and the silicon substrate 1 while using the first resist patterns 5 as a mask. A depth of the device isolation recess 1a is set to 350 nm, for example, from a surface of the silicon substrate 1.

A fluorine-series gas is used as the etching gas of the first silicon nitride film 4, a chlorine-series gas is used as the etching gas of the first silicon film 3 and the silicon substrate 1, and the fluorine-series gas is also used as the etching gas of the tunnel oxide film 2.

In this case, the device isolation recesses 1a may be formed by removing the first resist patterns 5 after the first silicon nitride film 4 is patterned while using the first resist patterns 5 as the mask, and then etching the first silicon film 3, the tunnel oxide film 2, and the silicon substrate 1 while using patterns of the first silicon nitride film 4 as a mask.

Figure 2D:
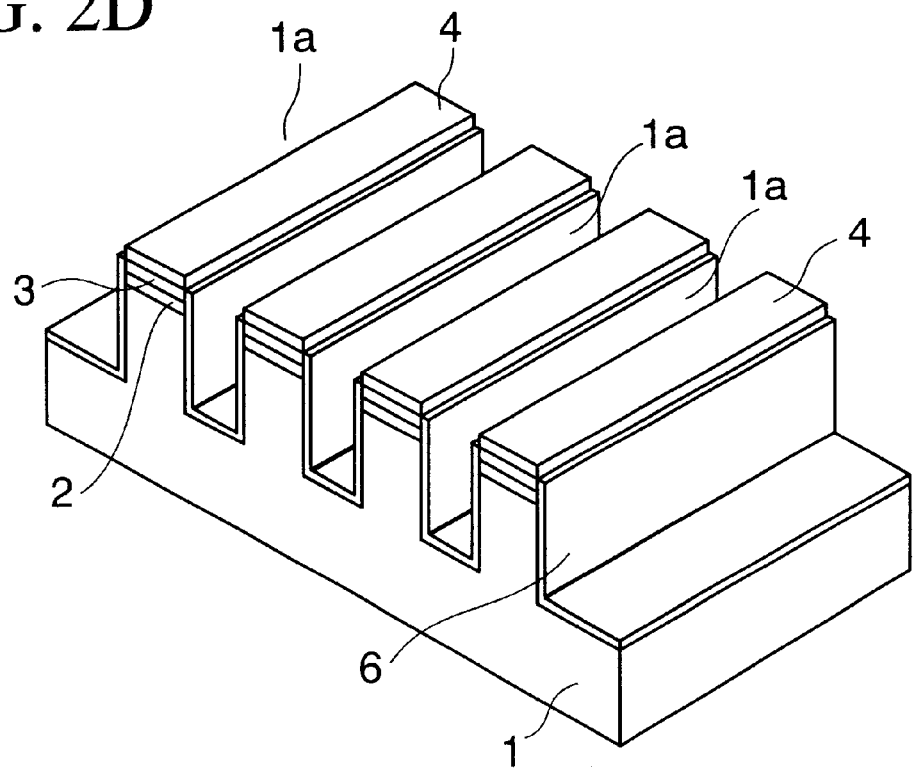

Then, the silicon substrate 1 is annealed at 900° C. in the oxygen atmosphere in the situation that the first resist patterns 5 are removed. Thus, as shown in FIG. 2D, an $SiO_2$ film 6 of 15 nm thickness is formed along inner surfaces of the device isolation recesses 1a.

Figure 2E:
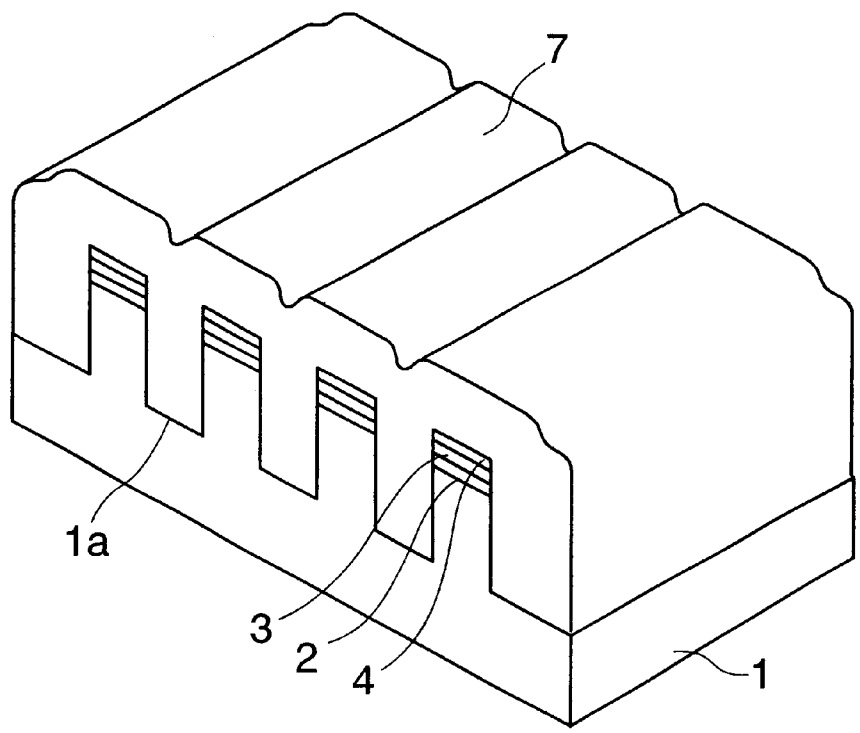

Then, as shown in FIG. 2E, an device isolation insulating film 7 made of $SiO_2$ is formed in the device isolation recesses 1a and on the first silicon nitride film 4 by the CVD method to have a thickness of 700 nm. As a result, the device isolation recesses 1a are brought into the state that they are covered completely with the device isolation insulating film 7. In this case, the $SiO_2$ film 6 on the inner surface of the device isolation recess 1a serves as a part of the device isolation insulating film 7.

Figure 3A:
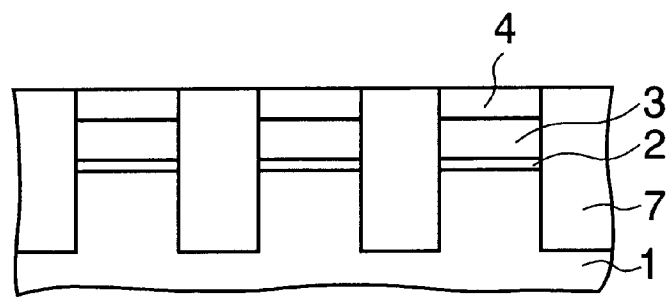
FIGS. 3A to 3E are sectional views showing steps of forming the flash memory cell according to the first embodiment of the present invention.

Then, as shown in FIG. 3A, the device isolation insulating film 7 is polished by the CMP (Chemical Mechanical Polishing) method until an upper surface of the first silicon nitride film 4 is exposed. In this case, since the first silicon nitride film 4 can function as the polishing stopper, it is easy to detect the end point of polishing.

Figure 2F:
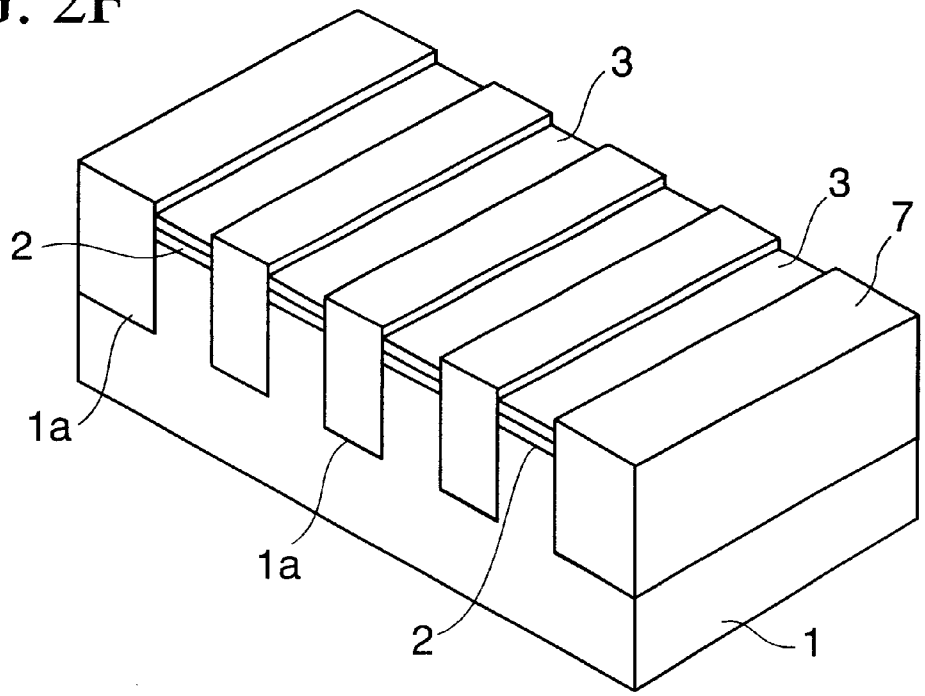
Figure 3B:
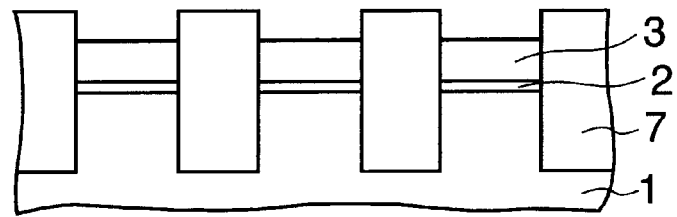

Then, as shown in FIG. 2F and FIG. 3B, the first silicon nitride film 4 is removed from an upper surface of the first silicon film 3 by using the hot phosphoric acid. As a result, the upper surface of the first silicon film 3 is exposed and also the device isolation insulating film 7 left in the device isolation recess 1a is projected from the upper surface of the first silicon film 3.

Figure 2G:
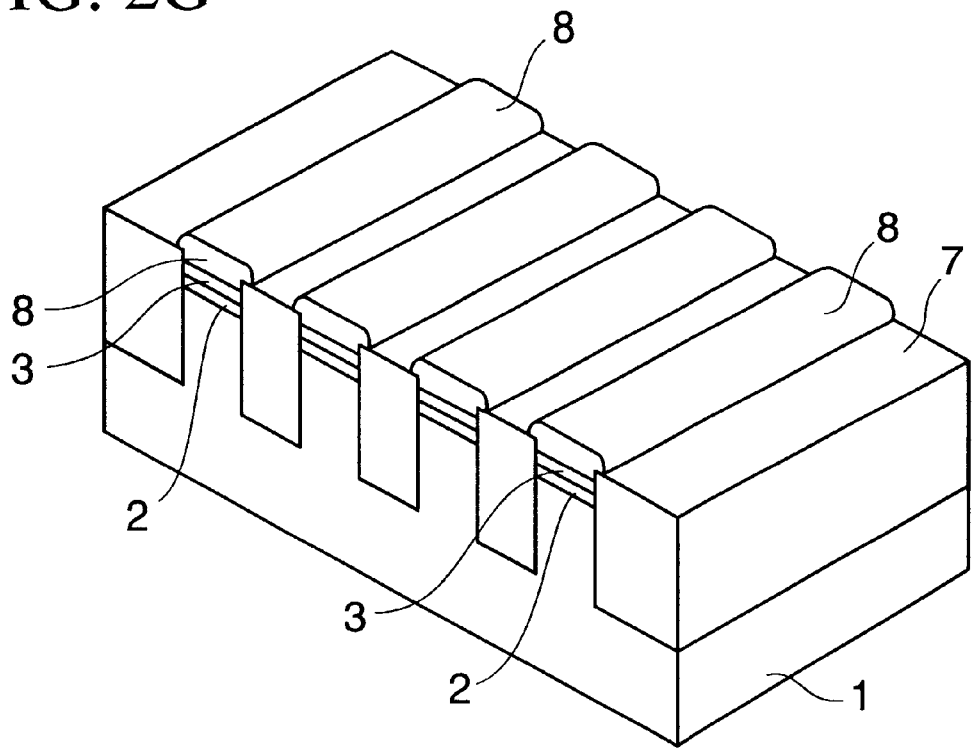
Figure 3C:
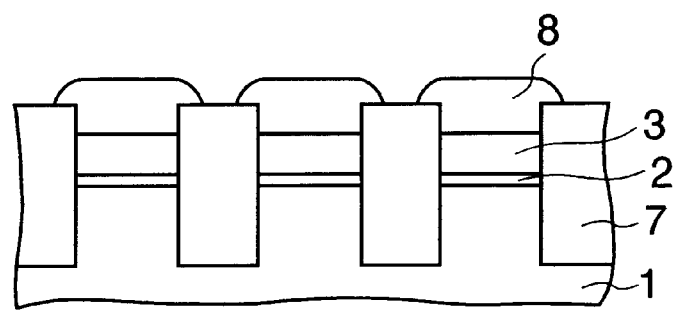

Then, as shown in FIG. 2G and FIG. 3C, a second silicon film 8 made of polysilicon is selectively grown on the first silicon film 3. As the selective growth method, for example, a dichlorsilane-series gas or a mixed gas consisting of the dichlorsilane-series gas and a chlorine-series gas (e.g., hydrochloric acid) is used. The reason for using such gas series is that the silicon constituting dichlorsilane ($SiH_2Cl_2$) acts as a growth element of the polysilicon whereas the chlorine constituting dichlorsilane or the chlorine in a hydrochloric acid-series gas as an addition gas has an action to etch the silicon. Accordingly, such gas has an action of suppressing the nuclear growth of the silicon on the surface of the device isolation insulating film 7 and also an action of selectively growing the second silicon film 8 on the first silicon film 3.

The second silicon film 8, which is selectively grown in this manner, as well as the first silicon film 3 is patterned by the later step to constitute the floating gate.

Such selective growth of the second silicon film 8 is carried out by flowing dichlorsilane of about 400 cc, hydrochloric acid (HCl) of about 0 to 200 cc, and hydrogen ($H_2$) of about 14.6 liter, for example, into the CVD atmosphere as the growth gas, setting the growth temperature to 850 to 900° C., setting the pressure in the CVD atmosphere to about 1330 Pa, and flowing the phosphine as the dopant. As a result, the second silicon film 8 containing the phosphorus at the impurity concentration of $0.5 \times 10^{20}$ atm/cm$^3$ is grown on the first silicon film 3 to have a thickness of 100 nm.

As another example of the conditions to achieve the similar growing effect, such a condition may be listed that the growth temperature and the growth atmospheric pressure are set to 700 to 900° C. and 2660 to 6650 Pa respectively and $SiH_2Cl_2$, HCl, and $H_2$ are supplied to the growth atmosphere as the growth gas by 100 cc, 110 cc, and 20 liter respectively, or that the growth temperature and the growth atmospheric pressure are set to 630 to 760° C. and 133 Pa respectively and SiH$_2$Cl$_2$ and HCl are supplied to the growth atmosphere as the growth gas by 30 to 150 cc, 10 to 50 cc, and 5 liter respectively.

Also, the silicon may be selectively grown by using monosilane (SiH$_4$). In this case, for example, the silicon may be grown by the ultra high vaccum (UHV) CVD in which the pressure in growing is extremely reduced and, for example, such a condition may be set that the pressure and the growth temperature are set to 0.1 Pa and 600° C. respectively and SiH$_4$, HCl, and H$_2$ are supplied to the growth atmosphere as the growth gas by 30 to 150 cc, 10 to 50 cc, and 5 liter respectively. In addition, as another method, the silicon may be selectively grown by the ECR plasma CVD method. In this case, for example, the growth temperature is set to 225° C. and SiH$_4$ and H$_2$ are used as the reaction gas.

The silicon may be selectively grown while doping the impurity such as phosphorus, etc. But the impurity may be doped into the undoped silicon by the ion-implantation method after such undoped silicon has been selectively grown.

Meanwhile, according to the above silicon growth conditions, there exists the selectivity such that the silicon is easily grown on the first silicon film 3 but the silicon is difficult to grow on the device isolation insulating film 7. Therefore, the second silicon film 8 is additionally grown only on the exposed surface of the first silicon film 3.

Also, in the growing process of the second silicon film 8, the second silicon film 8 starts to grow in the lateral direction and expands over the device isolation insulating film 7 at a point of time when the second silicon film 8 becomes higher than the device isolation insulating film 7. Here, since a growth ratio of the lateral direction to the longitudinal direction is about 0.9, the second silicon film 8 is grown to expand from the edge of the device isolation region to the center by about 80 nm if such second silicon film 8 is formed to project from the upper surface of the device isolation insulating film 7 by about 90 nm. Also, the upper surface of the second silicon film 8 expanding on the device isolation insulating film 7 is rounded and smoothly inclined.

In addition, in case the patterns are formed by etching the silicon film,

The second silicon film 8, which is selectively grown as described above, has the planar shape that is separated in plural along the centers of the device isolation insulating films 7.

Figure 2H:
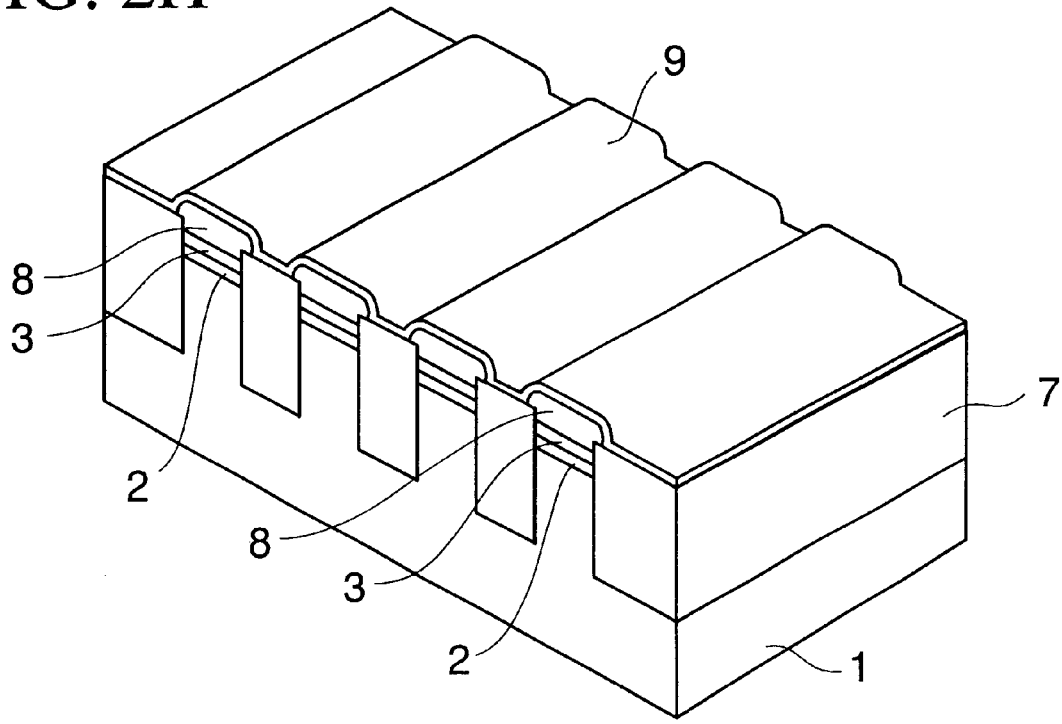
Figure 3D:
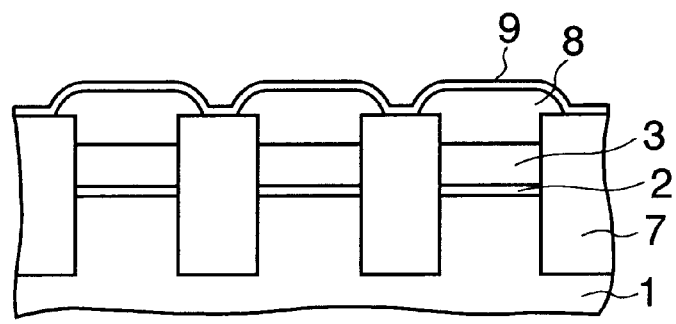

In turn, as shown in FIG. 2H and FIG. 3D, an ONO film 9 is formed as a coupling dielectric film on the second silicon film 8 and the device isolation insulating films 7. This ONO film 9 is formed by forming sequentially an SiO$_2$ film of 6 nm thickness and a silicon nitride film of 8.5 nm thickness by virtue of the CVD method and then annealing the silicon nitride film at the temperature of 950° C. for 6 hours in the oxygen atmosphere.

Then, although not particularly illustrated, the ONO film 9 and the silicon films 3, 8 in regions that are not covered with resist, e.g., peripheral circuit regions are removed by the dry etching while covering flash memory cell regions of the ONO film 9 with the resist, and then the tunnel oxide film 2 is wet-etched by the hydrofluoric acid, whereby the upper surface of the silicon substrate 1 is exposed in the regions that are not covered with the resist. Then, the ONO film 9 is exposed in the flash memory cell regions by removing the resist, and the silicon substrate 1 is exposed in remaining regions, e.g., transistor forming regions of the peripheral circuit regions.

After this, a gate oxide film (not shown) of 15 nm thickness is formed by thermally oxidizing the surface of the silicon substrate 1 in the transistor forming regions of the peripheral circuit regions, etc. In this case, the oxidation of the second silicon film 8 in the flash memory cell regions is prevented with the ONO film 9.

Figure 2I:
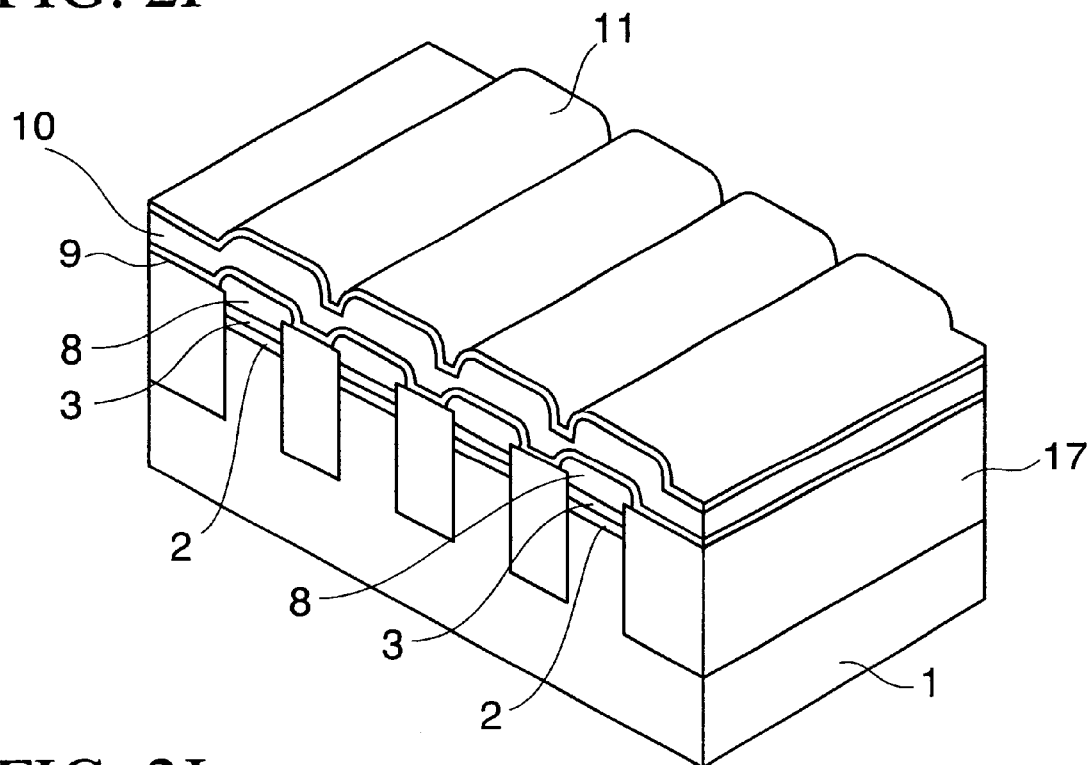
Figure 3E:
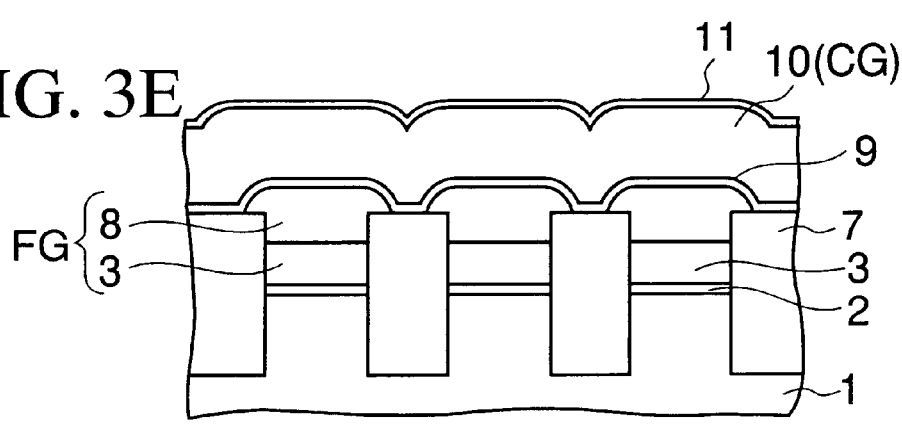

Then, as shown in FIG. 2I and FIG. 3E, an undoped and polysilicon third silicon film 10 of 150 nm thickness and a second silicon nitride film 11 of 20 nm thickness are grown sequentially over the silicon substrate 1 by the CVD method. As described later, the impurity is introduced into the third silicon film 10 when such impurity is ion-implanted to form the impurity diffusion layer in the silicon substrate 1.

Figure 2J:
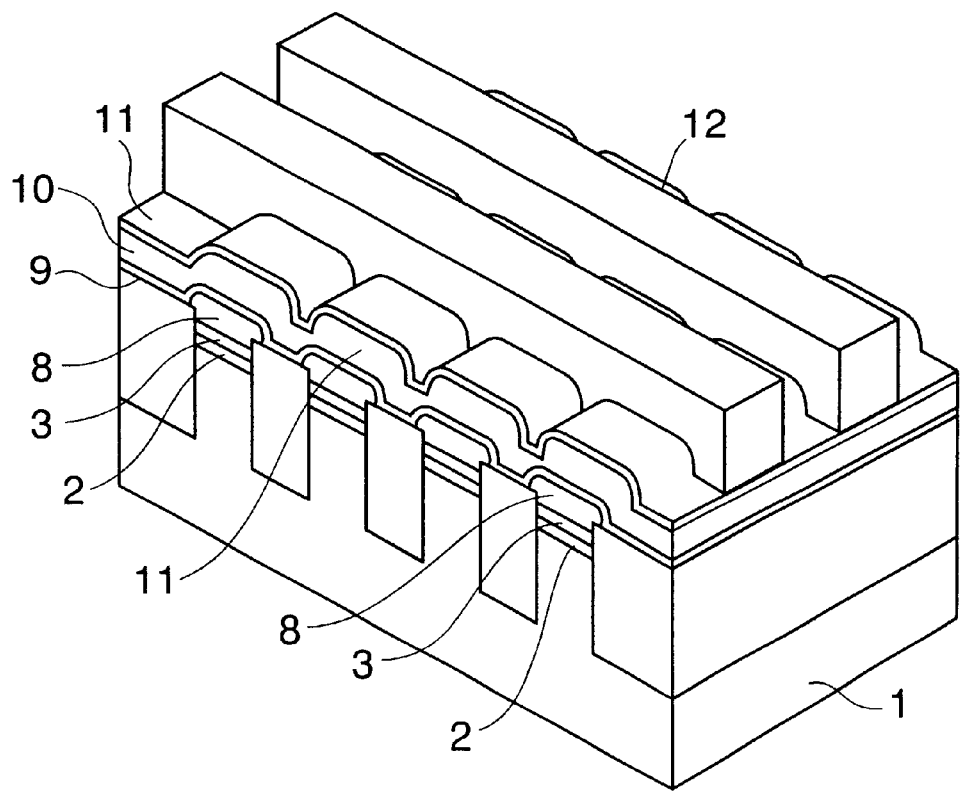

Then, as shown in FIG. 2J, resist patterns 12 each has a planar shape of a stack gate having a width of 0.16 μm are formed by coating the resist on the second silicon nitride film 11 and then exposing/developing this resist.

Then, the second silicon nitride film 11, the third silicon film 10, the ONO film 9, and the first and second silicon films 3, 8 are etched sequentially by using the resist patterns 12 as a mask. In this etching, regions other than the flash memory cell regions are covered with the resist.

Figure 2K:
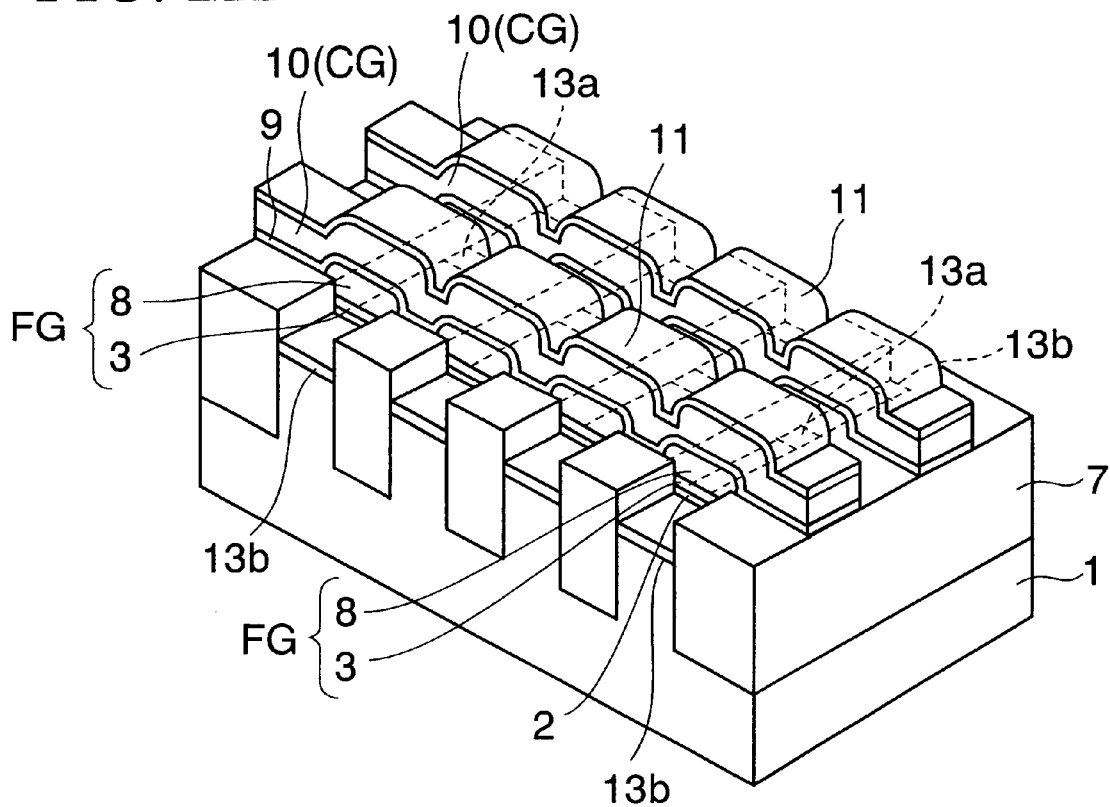

Accordingly, as shown in FIG. 2K, the third silicon film 10 serves as the control gate CG of the flash memory cell, and the silicon films 3, 8 left under the control gate CG have the shape of the floating gate FG. FIG. 2K shows the state that the resist patterns 12 are removed.

A width of the floating gate FG is narrow at its lower portion and is wide at its upper portion, as described above. The width of its lower surface that contacts to the tunnel oxide film 2 is 0.24 μm, for example, and the width of its portion that is higher than the device isolation insulating films 7 is about 0.4 μm at its maximum. Accordingly, the floating gate FG has the higher coupling ratio to the control gate CG.

Then, a gate electrode (not shown) made of the third silicon film 10 is formed by patterning the second silicon nitride film 11 and the third silicon film 10, that exist in the peripheral circuit regions, for example. In this patterning, the flash memory cell regions are covered with the resist.

In the state that regions except the flash memory cell regions are covered with the resist, impurity diffusion layers 13a, 13b serving as the source/drain regions are formed by implanting the arsenic ion (As$^+$) into the silicon substrate 1 on both sides of the floating gate FG at the acceleration energy of 40 keV and a dosage of $1.0 \times 10^{15}/\text{cm}^2$.

Then, the thermal oxidation film (not shown) of 5 nm is formed by thermally oxidizing the exposed surface of the silicon substrate 1 in the state that the resist is removed completely. Then, in order to form the LDD impurity diffusion layers of the n-type MOS transistor in the peripheral circuit region, the phosphorus ion (P$^+$) is implanted into the silicon substrate 1 on both sides of the gate electrode (not shown) in the peripheral circuit region at the acceleration energy of 30 keV and a dosage of $4.0 \times 10^{13}/\text{cm}^2$. In turn, in order to form the LDD impurity diffusion layers of the p-type MOS transistor in the peripheral circuit region, the boron fluoride ion (BF$_2^+$) is implanted into the silicon substrate 1 on both sides of another gate electrode (not shown) at the acceleration energy of 80 keV and a dosage of $4.0 \times 10^{13}/\text{cm}^2$. In introducing the impurity into the peripheral circuit region, the flash memory cell regions are covered with the resist. The resist is removed after the impurity ion implantation is completed. Also, the individual ion-implantation of the p-type impurity and the n-type impurity is executed by using the resist.

Figure 2L:
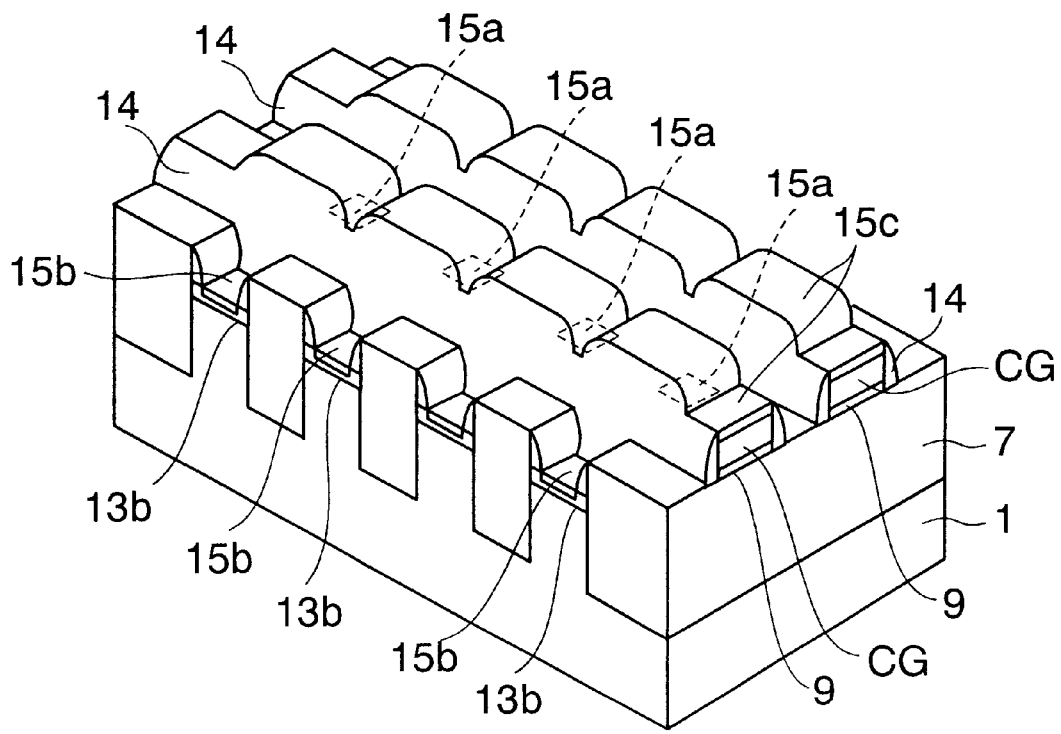

Next, steps required to get the state shown in FIG. 2L will be explained hereunder.

First, the SiO$_2$ film of 15 nm thickness and the silicon nitride film of 115 nm thickness are grown sequentially on the floating gate FG, the silicon substrate 1, the device isolation insulating films 7, etc. by the CVD method. Then, insulating sidewall spacers 14 are formed on the side walls of the floating gate FG and the control gate CG in the flash memory regions and the side walls of the gate electrodes (not shown) in the peripheral circuit regions by etching back them.

Then, the second silicon nitride film 11 on the control gate CG and the gate electrode (not shown) is removed by the phosphoric acid boil.

In addition, the impurity is ion-implanted into the silicon substrate 1 exposed on both sides of the gate electrode in the peripheral circuit region (not shown). In the LDD impurity diffusion layer of the n-type MOS transistor, $As^+$ is implanted into the silicon substrate 1 at the acceleration energy of 60 keV and a dosage of $3.0 \times 10^{15}/cm^2$. Also, in the LDD impurity diffusion layer of the p-type MOS transistor, $BF_2^+$ is implanted into the silicon substrate 1 on both sides of the gate electrode at the acceleration energy of 40 keV and a dosage of $2.0 \times 10^{15}/cm^2$. The individual ion-implantation of the p-type impurity and the n-type impurity is executed by using the resist. The flash memory cell region is covered with the resist during the above ion implantations, and the resist is removed after the ion-implanting step.

Then, ion seeds implanted in the silicon substrate 1 are activated by annealing the silicon substrate 1 in the nitrogen atmosphere at the temperature of 1000° C. for 10 seconds.

Then, a cobalt film of 13 nm thickness and a titanium nitride film of 30 nm thickness are formed sequentially on the control gate CG, the gate electrode (not shown), the impurity diffusion layers 13a, 13b, the device isolation insulating film 7, etc. by the sputter. After this, the cobalt film is caused to react with the silicon constituting the impurity diffusion layers 13a, 13b, the control gate CG, the gate electrode (not shown), etc. respectively, by annealing the silicon substrate 1 in the nitrogen atmosphere at the temperature of 500° C. for 30 seconds, and thus silicide layers are formed. Then, not only the titanium nitride film but also the unreacted cobalt film is removed by using the ammonium peroxide as the wet process.

Accordingly, in the flash memory cell region, cobalt silicide layers 15a, 15b, 15c are formed on an upper surface of the control gate CG and upper surfaces of the impurity diffusion layers 13a, 13b respectively.

Then, resistances of the cobalt silicide layers 15a, 15b, 15c are lowered by the annealing in the nitrogen atmosphere at 840° C. for 40 seconds.

Next, steps required to get the structure shown in FIG. 2M will be explained hereunder.

Figure 2M:
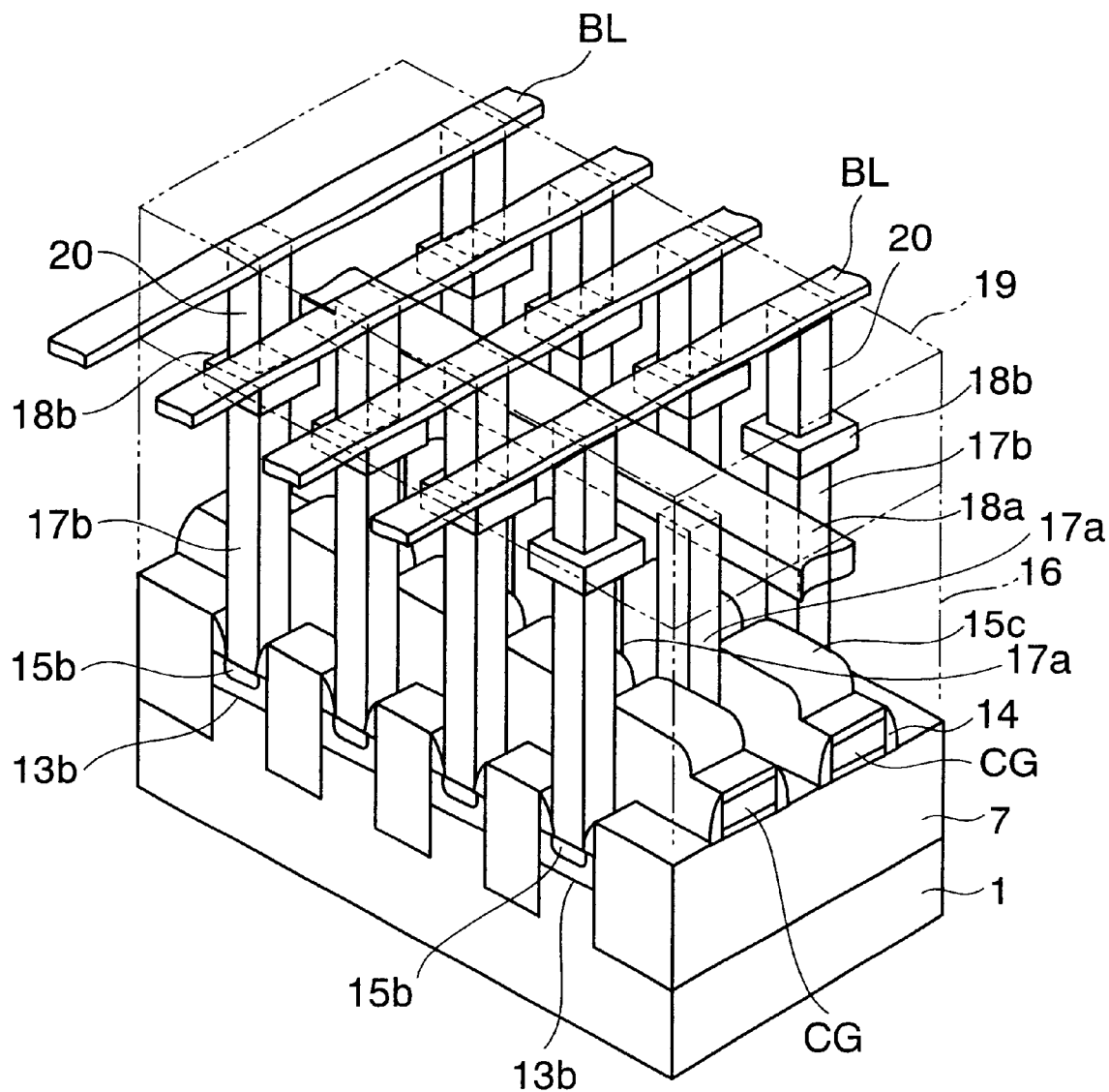

First, as shown in FIG. 2M, a first interlayer insulating film 16 is formed on the cobalt silicide layers 15a, 15b, 15c, the device isolation insulating film 7, etc. Then, first contact holes are formed on a plurality of impurity diffusion layers 13a, 13b of the memory cell respectively by patterning the first interlayer insulating film 16. Then, first conductive plugs 17a, 17b are buried in the first contact holes.

Then, a first metal film is formed on the first interlayer insulating film 16. Then, source wirings 18a that connect the first conductive plugs 17a on a plurality of impurity diffusion layers 13a serving as the sources in the word line direction are formed by patterning the first metal film. Also, conductive pads 18b are formed on the first conductive plugs 17b on the impurity diffusion layers 13b serving as the drains by patterning the first metal film.

In turn, a second interlayer insulating film 19 is formed on the source wirings 18a, the conductive pads 18b, and the first interlayer insulating film 16. Then, second contact holes are formed on the conductive pads 18b by patterning the second interlayer insulating film 19, and then second conductive plugs 20 are formed in the second contact holes.

Figure 4:
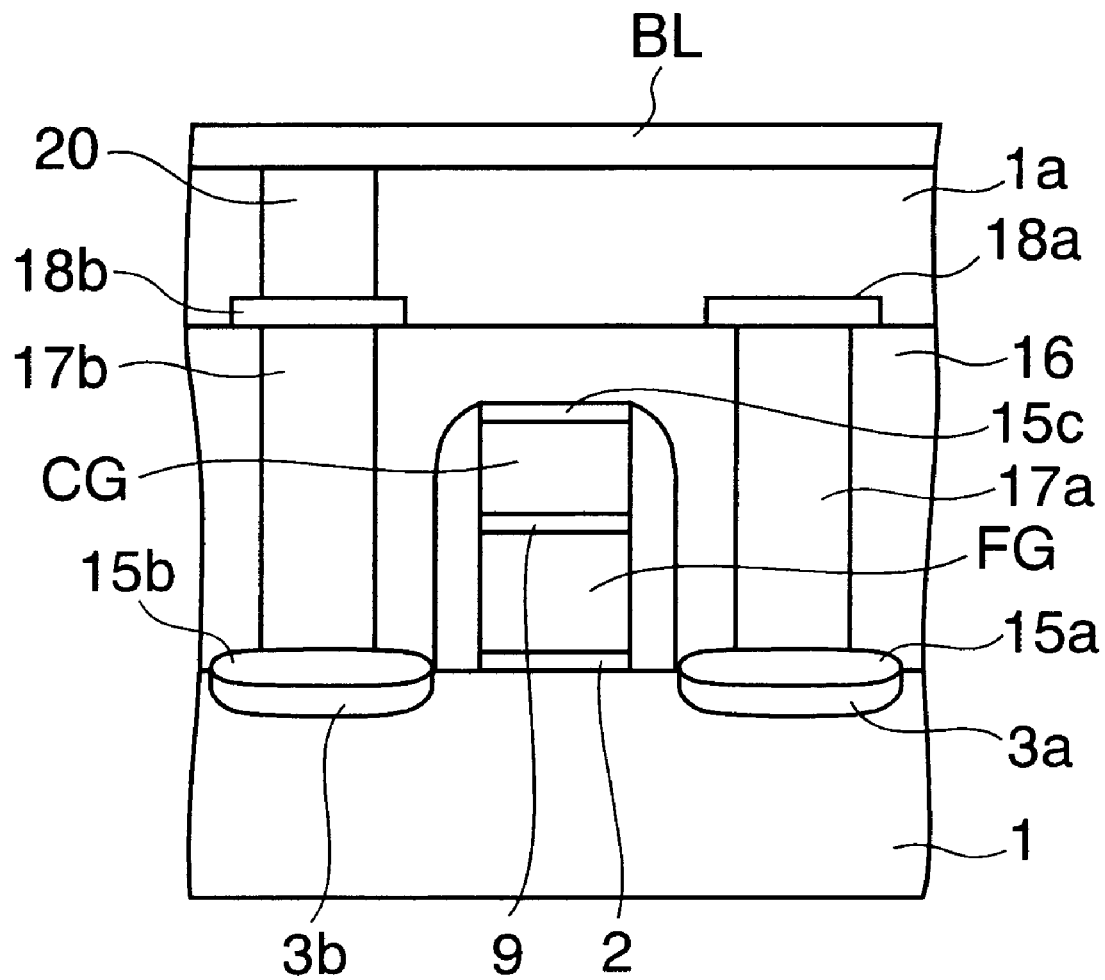
FIG. 4 is a sectional view showing the flash memory cell according to the first embodiment of the present invention.

Then, a second metal film is formed on the second interlayer insulating film 19. Then, bit lines BL that connect a plurality of second conductive plugs 20 in the direction intersecting the source wirings 18a are formed by patterning the second metal film. A cross section of one memory cell taken along the extending direction of the bit lines BL is shown in FIG. 4.

After this, an interlayer insulating film, wirings, etc. are formed further, but explanation of their details will be omitted.

According to the above steps, since the upper portion of the floating gate FG is formed by selectively growing the second silicon film 8 between the device isolation insulating films 7, the mask used to pattern the upper portion of the floating gate FG can be omitted and thus the throughput can be improved. In addition, it is possible to control the final width of the upper portion of the floating gate FG in the lateral direction by adjusting the growth conditions of the second silicon film 8.

As a result, according to the shape of the floating gate FG, the overlapping area with the control gate CG becomes larger than the contact area to the tunnel oxide film 2, so that the large coupling ratio can be obtained.

Also, since the extension of the second silicon film 8 constituting the upper portion of the floating gate FG in the lateral direction is generated in a self-aligned manner with respect to the device isolation insulating films 7 as STI, positional displacement between them seldom occurs. Thus, the area of the flash memory cell can be reduced rather than the prior art by narrowing the margin that is provided to absorb the positional displacement.

Also, the upper portion of the second silicon film 8 constituting the floating gate FG is changed linearly from its center to its edge, and neither the edge nor the step is generated on the upper surface. Therefore, there can be achieved the advantage that, since it is difficult for the etching residue to remain on the edge of the floating gate during the etching applied to form the control gate CG, the working can be made easy. In addition, because there is no corner on the upper portion of the floating gate FG, the film thickness of the ONO film 9 formed between the control gate CG and the floating gate FG is not locally reduced. As a result, the problem of the electric field concentration is not caused between the floating gate FG and the control gate CG.

(Second Embodiment)

In the first embodiment, as shown in FIG. 2E, the first silicon nitride film 4 is used as the CMP stopper when the device isolation insulating film 7 formed in the device isolation recess 1a and on the first silicon nitride film 4 is polished by the CMP. However, unless the first silicon nitride film 4 is provided, it is possible to use the first silicon film 3 as the CMP stopper. Therefore, in the present embodiment, the formation of the flash memory cell in which the formation of the first silicon nitride film 4 is omitted will be explained hereunder.

FIGS. 5A to 5E show steps of forming a flash memory cell according to a second embodiment of the present invention. FIGS. 6A to 6D show their sectional shapes. In these Figures, the same references as those in FIGS. 2A to 2M, FIGS. 3A to 3E, and FIG. 4 denote the same elements.

Figure 5A:
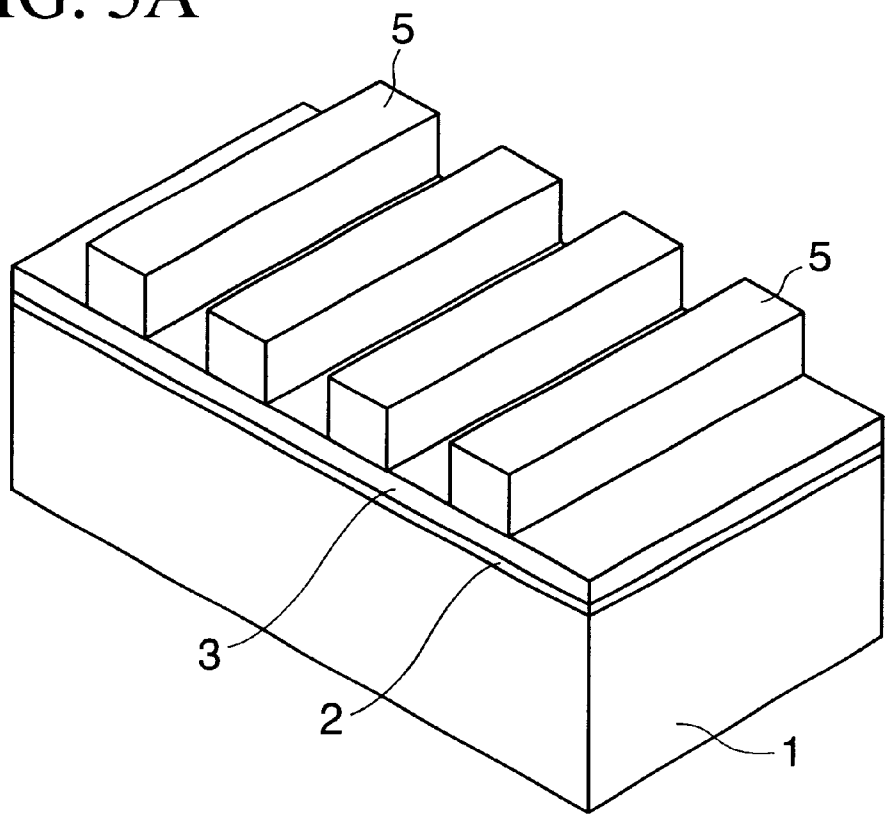
FIGS. 5A to 5E are perspective views showing steps of forming a flash memory cell according to a second embodiment of the present invention.

Steps required to get the state shown in FIG. 5A will be explained hereunder.

First, like the first embodiment, the tunnel oxide film 2 and the first silicon film 3 made of polysilicon are formed on the silicon substrate 1. In this case, the thickness of the first silicon film 3 is set to 20 nm and the phosphorus concentration is set to $0.5 \times 10^{20}$ atm/cm$^{-3}$.

Then, the first resist patterns 5 for covering the flash memory cell forming region are formed on the first silicon film 3. A width of the first resist pattern 5 and an interval between the first resist patterns 5 are set identically to those in the first embodiment. The portions that are not covered with the first resist patterns 5 are the device isolation regions.

In addition, the first silicon film 3 and the tunnel oxide film 2 are etched by using the first resist patterns 5 as a mask, and then the silicon substrate 1 is etched up to a depth of 350 nm. Accordingly, the device isolation recesses 1a are formed in the device isolation regions.

Figure 5B:
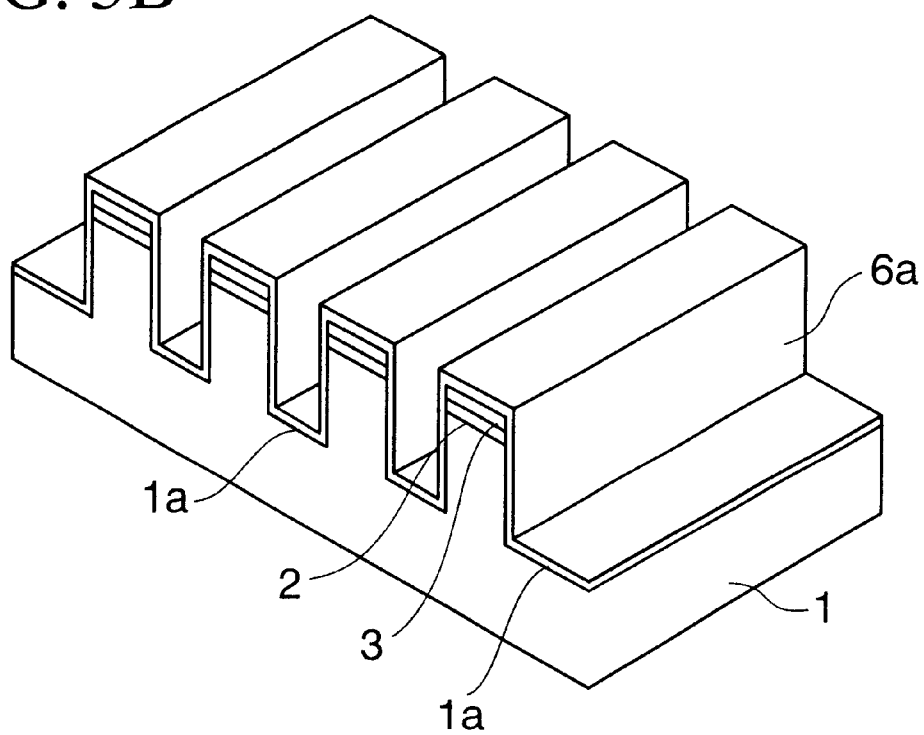

Then, as shown in FIG. 5B, an $SiO_2$ film 6 of 15 nm thickness is formed on inner surfaces of the device isolation recesses 1a by executing the annealing in the oxygen atmosphere at 900° C. At this time, the poly-crystallization of the first silicon film 3 is accelerated and also the surface of the first silicon film 3 is oxidized to form the SiO2 film 6a. As a result, the substantial film thickness of the first silicon film 3 is slightly reduced.

Figure 5C:
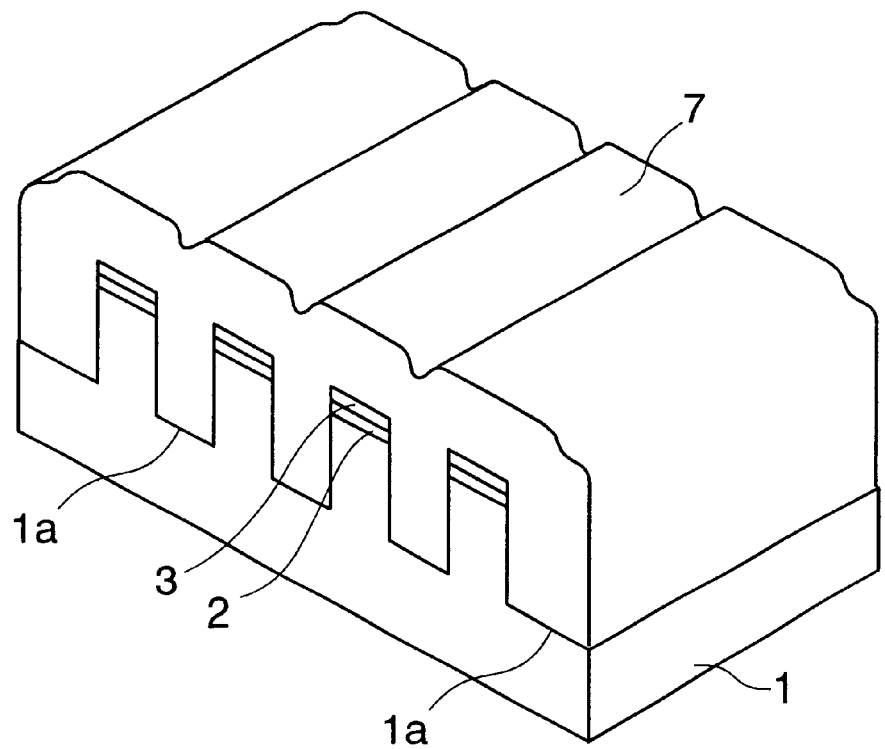

Then, as shown in FIG. 5C, the device isolation insulating film 7 made of $SiO_2$ and having a thickness of 700 nm is formed in the device isolation recesses 1a and over the first silicon film 3 via the SiO2 film 6a by the CVD method. Accordingly, the device isolation recesses 1a are completely filled with the device isolation insulating film 7. In this case, the SiO2 film 6a formed along inner surfaces of the device isolation recesses 1a act as a part of the device isolation insulating film 7.

Figure 5D:
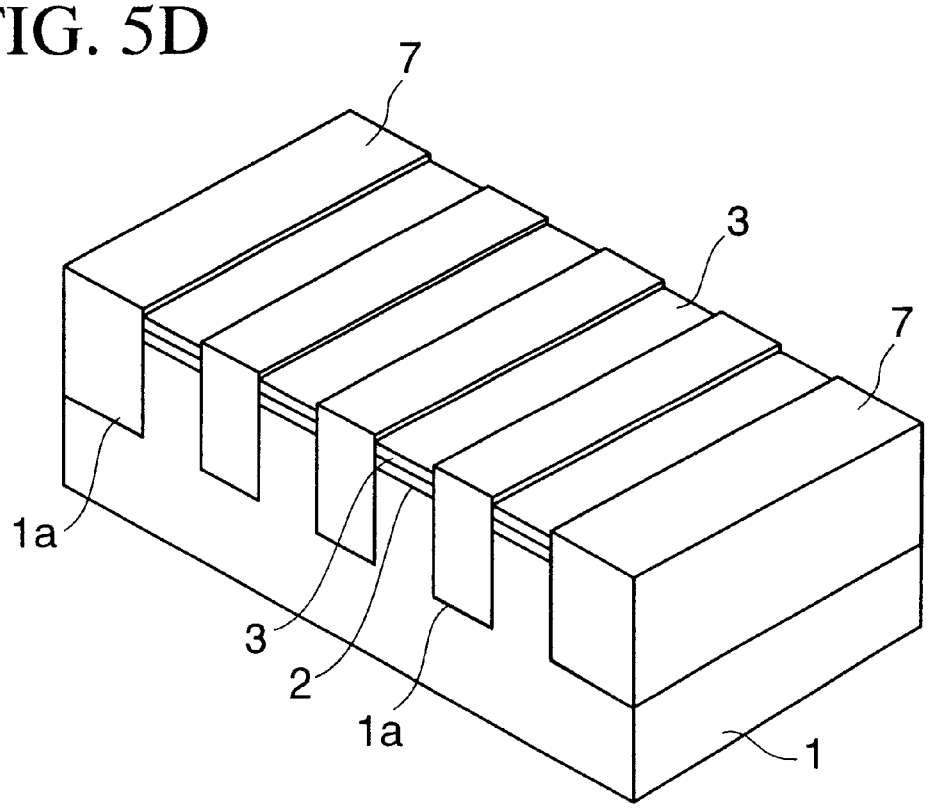
Figure 6A:
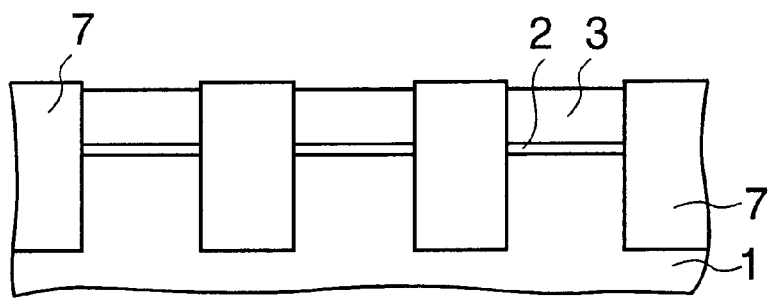
FIGS. 6A to 6D are sectional views showing steps of forming the flash memory cell according to the second embodiment of the present invention.

Then, as shown in FIG. 5D and FIG. 6A, the device isolation insulating film 7 is polished by the CMP method until the upper surface of the first silicon film 3 is exposed.

A level difference between the first silicon film 3 and the device isolation insulating film 7 is reduced rather than the first embodiment by this polishing.

Figure 5E:
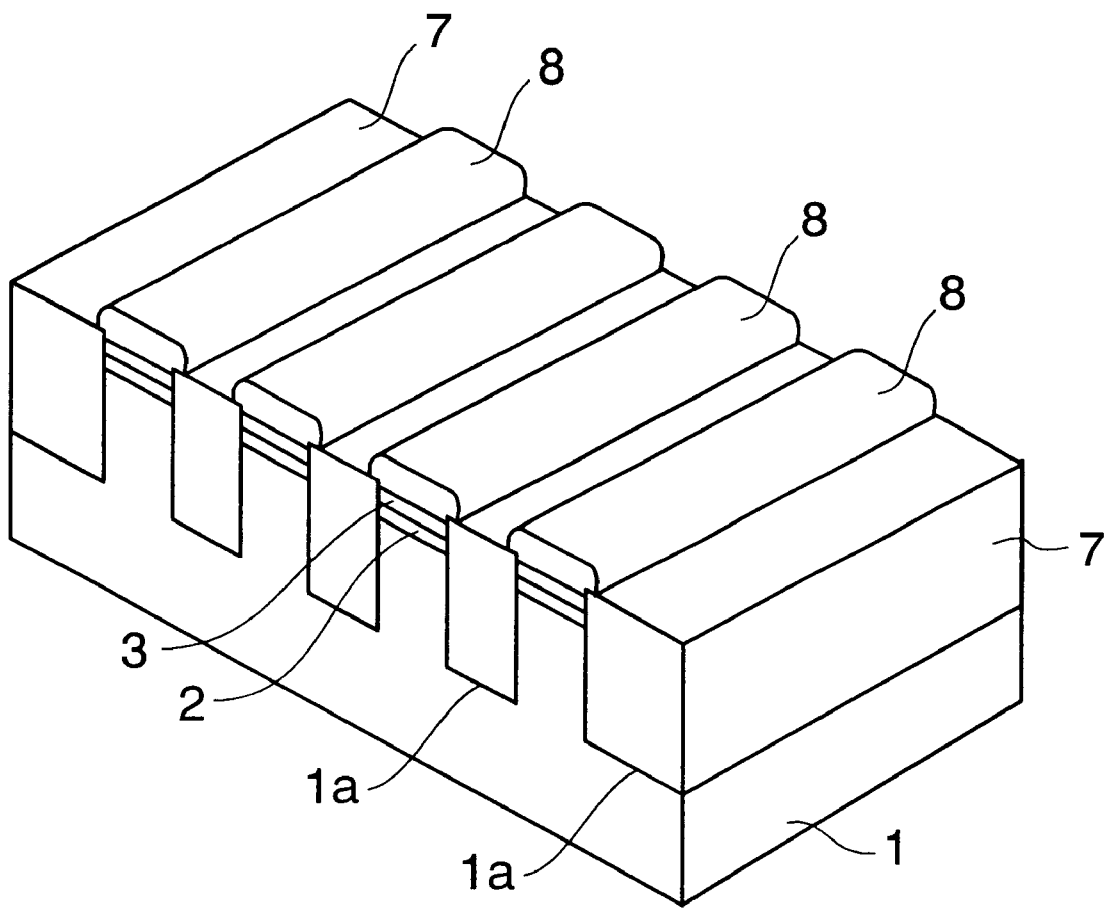
Figure 6B:
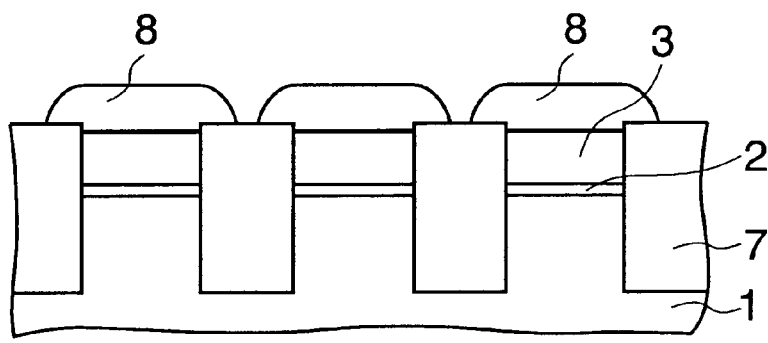

Then, as shown in FIG. 5E and FIG. 6B, the second silicon film 8 made of polysilicon is formed selectively on the first silicon film in the device forming regions by employing the similar method shown in the first embodiment.

It is similar to the first embodiment that the second silicon film 8 is formed to expand over the device isolation recesses 1a. However, if a total thickness of the film thickness of the first silicon film 3 and the film thickness of the second silicon film 8 is set equally in the first embodiment and the second embodiment respectively, a projection height of the second silicon film 8 from the device isolation insulating film 7 becomes higher in the second embodiment, and also an expansion amount of the second silicon film 8 in the lateral direction is increased in the second embodiment. Therefore, the interval between two neighboring second silicon films 8 formed on the device isolation recesses 1a becomes narrower than the first embodiment. In other words, if the expansion width of the second silicon film 8 into the device isolation regions is set equally to the first embodiment, the growth time of the second silicon film 8 can be shortened.

Figure 6C:
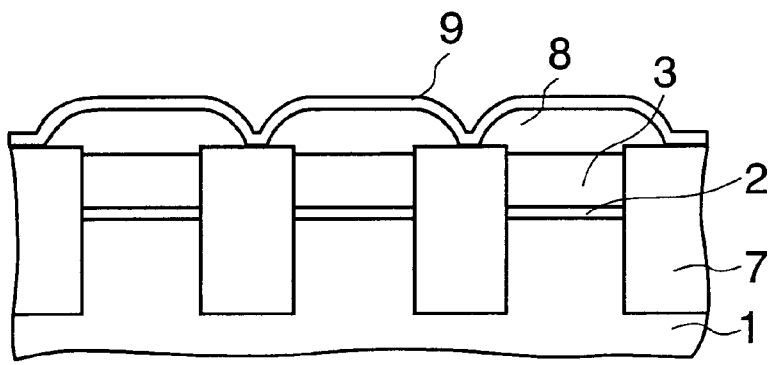
Figure 6D:
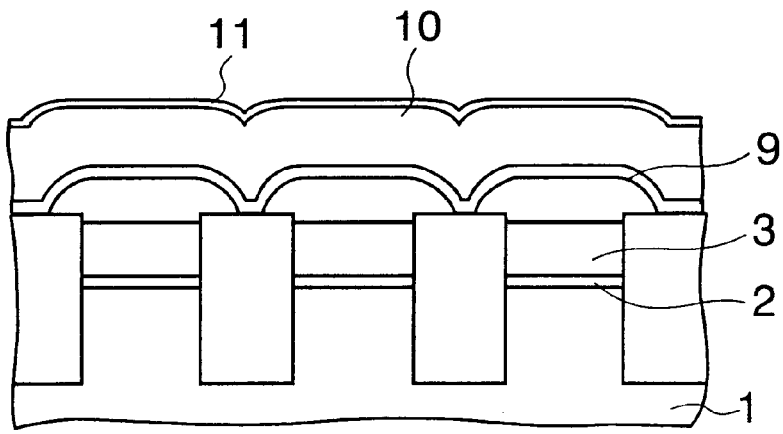

Then, as shown in FIGS. 6C and 6D, the ONO film 9, the third silicon film 10 made of polysilicon, and the second silicon nitride film 11 are formed on the second silicon film 8 and the device isolation insulating film 7. In turn, the control gate CG and the floating gate FG are formed by patterning the films from the third silicon film 10 to the first silicon film 3. Since subsequent steps are similar to those in the first embodiment, their explanation will be omitted.

According to the above steps, since the formation of the first silicon nitride film used to form the STI in the first embodiment is not required, the device isolation recesses 1a becomes effectively shallow by such thickness and thus the size of the memory cell can be reduced.

(Third Embodiment)

In the first embodiment and the second embodiment, the upper surface of the first silicon film 3 is lower than the device isolation insulating film 7 after the CMP applied to form the STI is completed. For this reason, since the second silicon film 8 tends to grow in the lateral direction after it has grown up to the same height as the device isolation insulating film 7, it is difficult to control the growth in the lateral direction.

Therefore, steps of facilitating the control of the second silicon film 8 in the lateral direction will be explained hereunder.

First, like the second embodiment, the tunnel oxide film 2 and the first silicon film 3 are formed sequentially on the silicon substrate 1, then the tunnel oxide film 2 and the first silicon film 3 are patterned by using the resist pattern, then the device isolation recesses 1a are formed on the silicon substrate 1, and then the resist pattern is removed. Then, the $SiO_2$ film of 15 nm thickness is formed on the inner surfaces of the device isolation recesses 1a by the thermal oxidation.

Figure 7A:
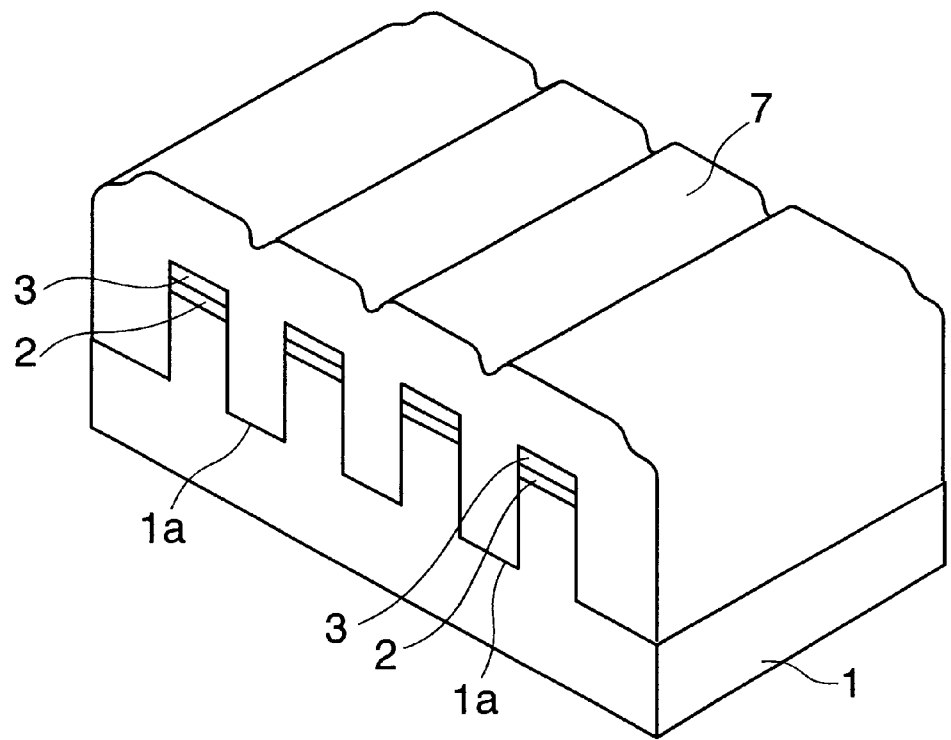
FIGS. 7A to 7C are perspective views showing steps of forming a flash memory cell according to a third embodiment of the present invention.

Then, as shown in FIG. 7A, the device isolation insulating film 7 made of $SiO_2$ is formed in the device isolation recesses 1a and over the first silicon film 3 by the CVD method to have a thickness of 700 nm. Accordingly, the device isolation recesses 1a are filled perfectly with the device isolation insulating film 7. In this case, the $SiO_2$ film formed along the inner surfaces of the device isolation recesses 1a acts as a part of the device isolation insulating film 7.

Figure 7B:
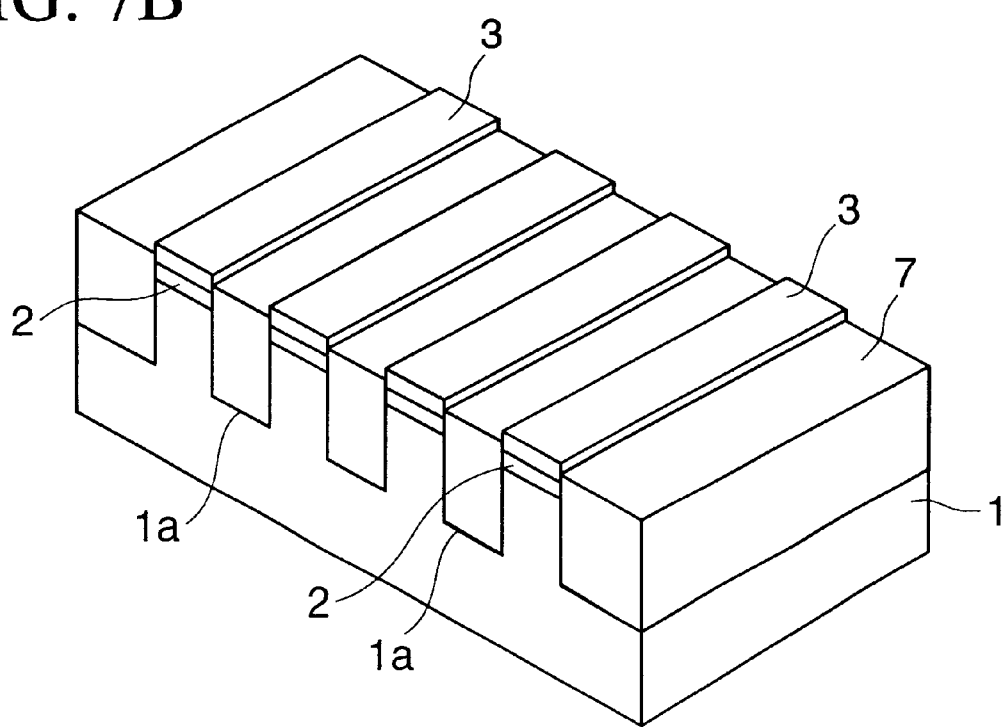

Then, like the second embodiment, the upper surface of the first silicon film 3 is exposed by polishing the device isolation insulating film 7 by virtue of the CMP method while using the first silicon film 3 as the CMP stopper. Then, as shown in FIG. 7B, the upper surface of the device isolation insulating film 7 is caused by the over-polishing to retreat to the position that is lower than the upper surface of the first silicon film 3 by 10 nm.

Figure 7C:
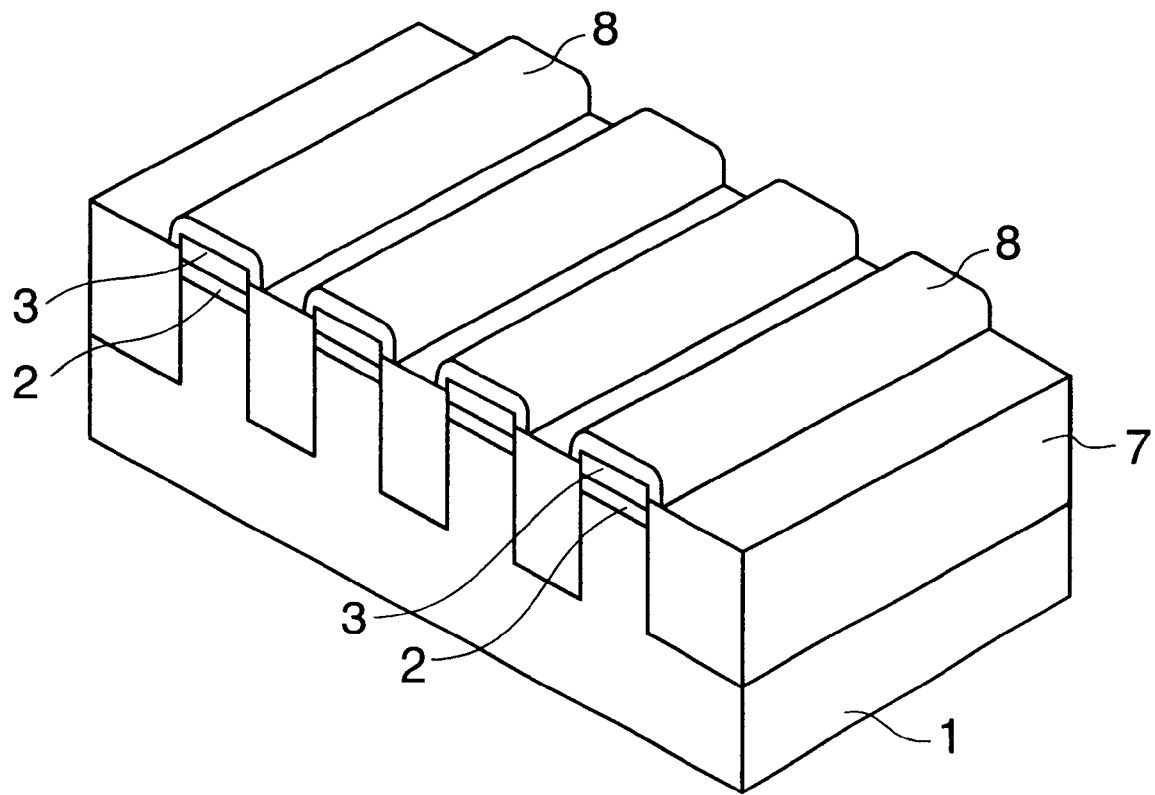

After this, the second silicon film 8 is selectively grown on the first silicon film 3 by the same method shown in the first embodiment. In this case, as shown in FIG. 7C, since the upper portion of the first silicon film 3 is projected from the device isolation insulating film 7, the growth of the second silicon film 8 in the lateral direction is started on the surface of the first silicon film 3 simultaneously with the starting of the growth in the longitudinal direction (film thickness direction). Therefore, the control of the width in the lateral direction can be facilitated. Since the shape of the second silicon film 8 can be controlled geometrically in the growth in the longitudinal direction, the desired shape of the floating gate can be obtained.

Since the subsequent steps are similar to those in the first embodiment, their explanation will be omitted hereunder.

The method of forming the upper surface of the first silicon film 3 higher than the upper surface of the device isolation insulating film 7 is not limited to the above-mentioned over-polishing of the device isolation insulating film 7. For example, there is the method of polishing the device isolation insulating film 7 by the CMP method under the conditions shown in the first or second embodiment and then selectively etching the device isolation insulating film 7 by the hydrofluoric acid, etc.

As described above, according to the present invention, the second semiconductor film is selectively grown on the first semiconductor film being put between the device isolation insulating films in the STI structure and also the second semiconductor film is grown to extend over the device isolation insulating film, so that the first and second semiconductor films can be used as the floating gate of the flash memory cell. Therefore, since the area of the floating gate that overlaps with the control gate is set wider than the area of the floating gate that contacts to the tunnel insulating film, the higher integration of the memory cell can be achieved and also the coupling capacitance between the floating gate and the control gate can be increased.

The second semiconductor film serving as the upper portion of the floating gate is shaped in a self-aligned manner, the alignment margin can be made small and the reduction of the cell area can be achieved.

Also, if the dielectric film is formed on the floating gate and then the film serving as the control gate is formed, the etching residue is hardly generated on the gentle portion of the control gate in patterning this film and thus the working can be made easy.

In addition, since side portions of the upper surface of the second semiconductor film serving as the floating gate are formed as the smooth curved surface, the film thickness of the dielectric film formed on the upper surface of the floating gate becomes uniform and thus the electric field concentration applied to the dielectric film can be avoided. As a result, the insulating withstanding voltage between the control gate and the floating gate can be kept highly.

What is claimed is:

1. A semiconductor device comprising:
    a first semiconductor film constituting a lower portion of a floating gate formed on a device forming region of a semiconductor substrate via a tunnel insulating film;
    device isolation recesses formed in the first semiconductor film, substrate, adjacent to the device forming region;
    a device isolation insulating film buried in the device isolation recesses, and having a planarized upper surface
    a second semiconductor film formed on the first semiconductor film as an upper portion of the floating gate and having an extended portion on the planarized upper surface of the device isolation insulating film, where the extended portion extending in a lateral direction such that a film thickness is thinned continuously from the device forming region to the device isolation insulating film;
    a dielectric film formed on the second semiconductor film; and
    a control gate formed on the floating gate via the dielectric film.

2. A semiconductor device according to claim 1, wherein the upper portion of the floating gate has a portion whose width is wider than the lower portion.

3. A semiconductor device according to claim 1, wherein an upper surface of the floating gate has a curved inclined surface in a direction from the device forming region to the device isolation insulating film.

4. A semiconductor device according to claim 1, wherein the first semiconductor film and the second semiconductor film is formed of polysilicon respectively.

5. A semiconductor device according to claim 1, wherein the dielectric film is formed of an ONO film.

6. A semiconductor device manufacturing method comprising the steps of:
    forming a tunnel insulating film on a semiconductor substrate;
    forming a first semiconductor film constituting a lower portion of a floating gate on the tunnel insulating film;
    forming device isolation recesses by etching device isolation regions of the first semiconductor film, the tunnel insulating film, and the semiconductor substrate;
    forming a device isolation insulating film in the device isolation recesses and on the first semiconductor film;
    removing the device isolation insulating film from an area above the first semiconductor film and also thinning the device isolation insulating film above the device isolation recesses;
    growing selectively a second semiconductor film serving as an upper portion of the floating gate on the first semiconductor film and also growing the second semiconductor film on the device isolation insulating film to extend in a lateral direction from the device isolation insulating film;
    forming a dielectric film on the floating gate; and
    forming a conductive film serving as a control gate on the dielectric film.

7. A semiconductor device manufacturing method according to claim 6, wherein the dielectric film is formed of an ONO film.

8. A semiconductor device manufacturing method according to claim 6, wherein further comprising the steps of:
    forming a polishing stop film on the first semiconductor film, before forming the device isolation recess;
    forming a top of the device isolation recesses by etching the polishing stop film on the device isolation region;
    forming the device isolation insulating film on the first semiconductor film through the polishing stop film;
    Polishing the device isolation insulating film to remove from an upper face of the polishing stop film and to thin the device isolation insulating film above the device isolation recesses; and
    removing the polishing stop film, before growing the second semiconductor film.

9. A semiconductor device manufacturing method according to claim 8, wherein the first semiconductor film and the second semiconductor film is formed of polysilicon respectively, and the polishing stop film is formed of a silicon nitride film.

10. A semiconductor device manufacturing method according to claim 8, further comprising the step of setting an upper surface of the device isolation insulating film formed on the device isolation recesses lower than an upper surface of the first semiconductor film by further thinning the device isolation insulating film on the device isolation recesses, after the device isolation insulating film is removed from the upper surface of the polishing stop film but before the second semiconductor film is formed.

11. A semiconductor device manufacturing method according to claim 10, wherein thinning of the device isolation insulating film in the device isolation regions is carried out by over-polishing or selective etching.

12. A semiconductor device manufacturing method according to claim 6, wherein further comprising the step of setting an upper surface of the device isolation insulating film on the device isolation recesses lower than an upper surface of the first semiconductor film by further thinning the device isolation insulating film on the device isolation recesses, after the device isolation insulating film is removed from the upper surface of the first semiconductor film but before the second semiconductor film is formed.

13. A semiconductor device manufacturing method according to claim 12, wherein thinning of the device isolation insulating film in the device isolation regions is carried out by over-polishing or selective etching.

14. A semiconductor device manufacturing method according to claim 6, wherein removal of the device isolation insulating film from the device forming regions and thinning of the device isolation insulating film on the device isolation recesses are carried out simultaneously by a chemical mechanical polishing method.

15. A semiconductor device manufacturing method according to claim 6, wherein side surfaces of the second semiconductor film are formed to have a smooth curved surface on the device isolation insulating film on the device isolation recesses.

16. A semiconductor device manufacturing method according to claim 6, wherein selective growth of the second semiconductor film is carried out by a vapor deposition using a gas containing silicon and chlorine.

17. A semiconductor device manufacturing method according to claim 16, wherein the gas consists of any one of a mixed gas of silane and hydrochloric acid, or a dichlorsilane gas, or a mixed gas of a dichlorsilane gas and hydrochloric acid.

18. A semiconductor device manufacturing method according to claim 6, wherein the film constituting the control gate is a third semiconductor film into which an impurity is doped in growth or into which the impurity is doped after growth.

* * * * *